(12) United States Patent
Loh

(10) Patent No.: US 7,078,254 B2
(45) Date of Patent: Jul. 18, 2006

(54) LED PACKAGE DIE HAVING A SMALL FOOTPRINT

(75) Inventor: Ban P. Loh, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/034,598

(22) Filed: Jan. 13, 2005

(65) Prior Publication Data

US 2005/0145858 A1    Jul. 7, 2005

Related U.S. Application Data

(62) Division of application No. 10/721,641, filed on Nov. 25, 2003, now Pat. No. 6,897,486.

(60) Provisional application No. 60/431,501, filed on Dec. 6, 2002.

(51) Int. Cl.
*H01L 21/00* (2006.01)

(52) U.S. Cl. .......................................... 438/26; 313/512

(58) Field of Classification Search ..................... None
See application file for complete search history.

(56) References Cited

U.S. PATENT DOCUMENTS

| 4,267,559 | A | * | 5/1981 | Johnson et al. ............... 257/99 |
| 5,173,839 | A | * | 12/1992 | Metz, Jr. ...................... 361/706 |
| 5,785,418 | A | * | 7/1998 | Hochstein ..................... 362/373 |
| 5,789,772 | A | * | 8/1998 | Jiang ............................. 257/96 |
| 5,841,177 | A | * | 11/1998 | Komoto et al. .............. 257/431 |
| 5,869,883 | A | * | 2/1999 | Mehringer et al. .......... 257/667 |
| 5,959,316 | A | * | 9/1999 | Lowery ......................... 257/98 |
| 5,998,925 | A | * | 12/1999 | Shimizu et al. .............. 313/503 |
| 6,238,599 | B1 | * | 5/2001 | Gelorme et al. .............. 252/514 |
| 6,274,924 | B1 | * | 8/2001 | Carey et al. ................. 257/676 |
| 6,307,272 | B1 | * | 10/2001 | Takahashi et al. ........... 257/787 |
| 6,329,706 | B1 | * | 12/2001 | Nam ............................ 257/666 |
| 6,335,548 | B1 | * | 1/2002 | Roberts et al. ................ 257/98 |

FOREIGN PATENT DOCUMENTS

| JP | 2003298117 | * | 10/2003 |
| JP | 20022103977 | * | 10/2003 |

OTHER PUBLICATIONS

RE37,707 Bozzini et al., May 2002.*

* cited by examiner

*Primary Examiner*—David A. Zarneke
(74) *Attorney, Agent, or Firm*—Harness Dickey & Pierce P.L.C.

(57) ABSTRACT

A light emitting die package and a method of making the light emitting die package are disclosed. The die package includes a stem substrate having grooves, a wire lead attached to the grooves, and a light emitting diode (LED) mounted on the stem substrate. Also coupled to the substrate are a sleeve, a reflector, and a lens. To make the light emitting die package, a long substrate is formed and wire leads are attached to the substrate. Then, the substrate including the attached wire leads is cut to predetermine lengths to form individual stem substrates. To each stem substrate, LED, reflector, and lens are coupled.

5 Claims, 5 Drawing Sheets

LED PACKAGE DIE HAVING A SMALL FOOTPRINT

CROSS REFERENCE TO RELATED APPLICATIONS

This application claims the benefit under 35 USC sections 120 and 121 of (is a divisional of) U.S. patent application Ser. No. 10/721,641 filed Nov. 25, 2003 now U.S. Pat. No. 6,897,486 entitled "LED package die having a small footprint," which, in turn, claims the benefit 35 USC sections 119 and 120 of U.S. Provisional Patent Application Ser. No. 60/431,501 filed Dec. 6, 2002 entitled "LED package with a long stem body as heat-spreader and a small footprint."

BACKGROUND

The present invention relates to the field of packaging semiconductor devices, and more particularly to packaging light emitting diodes.

Light emitting diodes (LEDS) such as light emitting diodes are often packaged within leadframe packages. A leadframe package typically includes a molded plastic body which encapsulates an LED, a lens portion, and thin metal leads connected to the LED and extending outside the plastic body. The metal leads of the leadframe package serve as the conduit to supply the LED with electrical power and, at the same time, may act to draw heat away from the LED. Heat is generated by the LED when power is applied to the LED to produce light. A portion of the leads extends out from the package body for connection to circuits external to the leadframe package.

Some of the heat generated by the LED is dissipated by the plastic package body; however, most of the heat is drawn away from the LED via the metal components of the package. The metal leads are typically very thin and have a small cross section. For this reason, capacity of the metal leads to remove heat from the LED is limited. This limits the amount of power that can be sent to the LED thereby limiting the amount of light that can be generated by the LED.

To increase the capacity of an LED package to dissipate heat, in one LED package design, the LED is placed within a cavity of a heatsink slug. Then, the heatsink slug is surrounded by a plastic body except for its bottom surface. For example, some LUXEON™ LED packages by Lumileds Lighting, LLC embodies such a design. Here, the heatsink slug increases the capacity of the LED package to dissipate heat; however, the LED-in-cavity design is relatively difficult and costly to manufacture. Further, the heat dissipation is limited because of its limited exposed surface (the bottom surface only).

In another LED package design, the leads of the leadframe are extended (in various shapes and configurations) beyond the immediate edge of the LED package body. This increases the surface area of the portions of the leads exposed to the surrounding air. The increased exposed surface area of the extended leads increases the capacity of the LED package to dissipate heat; however, the extended leads increase the size of the LED package requiring relatively large area on a circuit board. Circuit board area is a scarce and costly factor in many applications.

Another undesirable aspect of the current leadframe package designs relates to problems associated with thermal expansion of the package. When heat is generated, the LED package experiences thermal expansion. Each of the parts of the LED package has a different coefficient of thermal expansion (CTE). For example, the CTE of the LED, the CTE of the package body, the CTE of the leads, and the CTE of lens are different from each other. For this reason, when heated, each of these parts experience different degrees of thermal expansion resulting in mechanical stresses between the parts of the package thereby adversely affecting its reliability.

Consequently, there remains a need for an improved LED package that overcomes or alleviates one or more of the shortcomings of the prior art packages.

SUMMARY

The need is met by the present invention. In a first embodiment of the present invention, a light emitting die package includes a stem substrate, a wire lead, and a light emitting diode (LED) mounted on the stem substrate. The stem substrate has a first end surface and a second end surface and defines at least one groove. The wire lead runs along the groove of the stem substrate, terminating at the first end surface. The light emitting diode (LED) mounted is mounted on the first end surface. The LED makes electrical and thermal contact with the stem substrate. The LED is also connected to the wire lead.

In a second embodiment of the present invention, a light emitting die package array includes an array housing having an external heatsink and reflector bowl. The array housing defines die package spaces. A plurality of light emitting die packages mounted in the die package spaces, each light emitting die having a light emitting die package includes a stem substrate, a wire lead, and a light emitting diode (LED) mounted on the stem substrate. The stem substrate has a first end surface and a second end surface and defines at least one groove. The wire lead runs along the groove of the stem substrate, terminating at the first end surface. The light emitting diode (LED) mounted is mounted on the first end surface. The LED makes electrical and thermal contact with the stem substrate. The LED is also connected to the wire lead.

In a third embodiment of the present invention, a method of manufacturing a light emitting die package is disclosed. First, a stem substrate rod having a predetermined length is fabricated, the stem substrate rod defining at least one groove. Wire leads are attached on the groove of the stem substrate rod. Next, the stem substrate rod including the attached wire leads are cut to a predetermined length thereby forming an individual stem substrate. The individual stem substrate is planarized to form a first end surface. A light emitting diode (LED) is mounted on the first end surface, the LED making electrical and thermal contact with the stem substrate, the LED also connected to the wire lead.

Other aspects and advantages of the present invention will become apparent from the following detailed description, taken in conjunction with the accompanying drawings, illustrating by way of example the principles of the invention.

DETAILED DESCRIPTION

Figure 1:
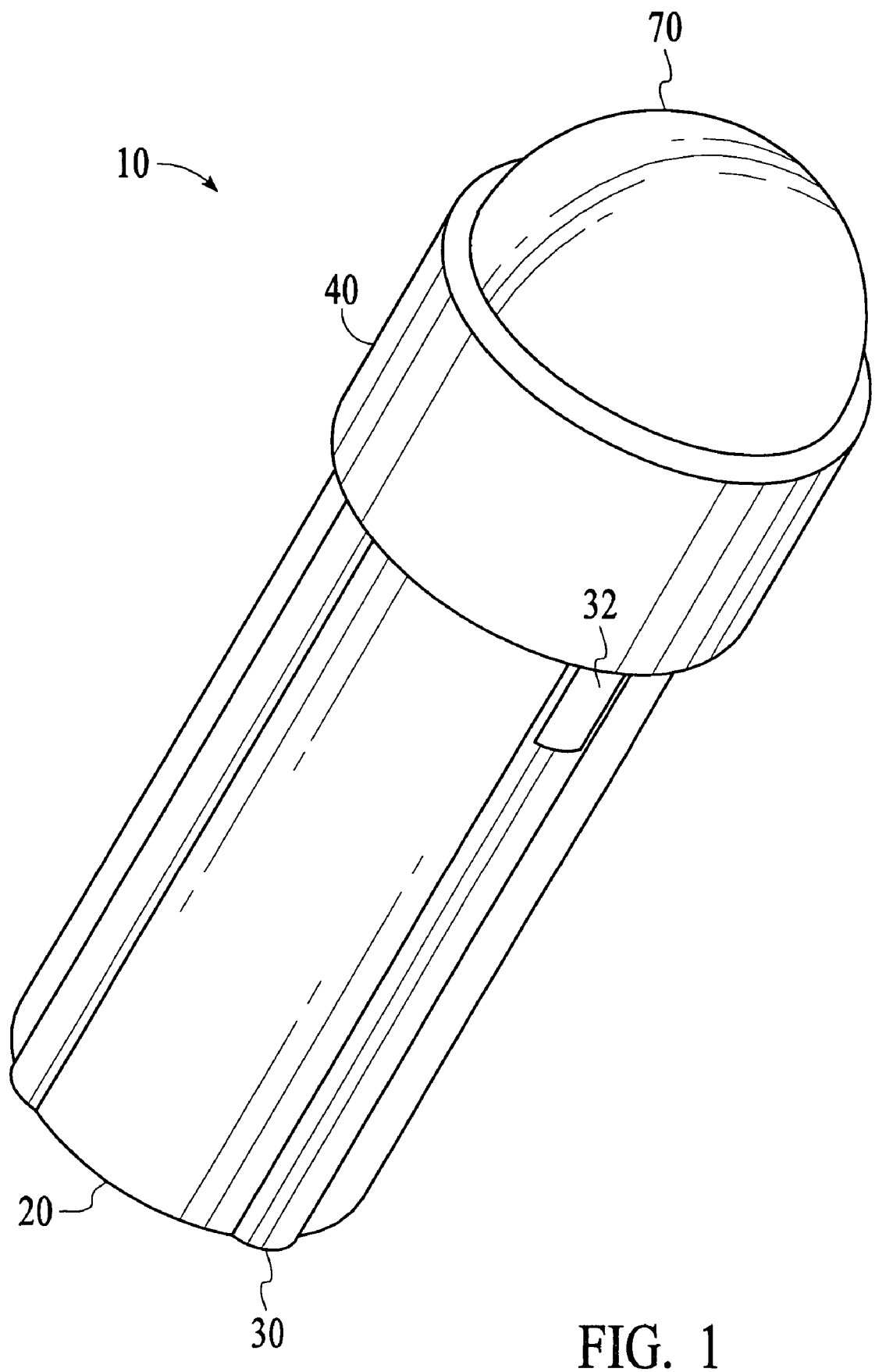
FIG. 1 is a perspective view of a light emitting die package according to one embodiment of the present invention.

The present invention will now be described with reference to the FIGS. 1 through 4, which illustrate various embodiments of the present invention. As illustrated in the Figures, some sizes of structures or portions are exaggerated relative to other structures or portions for illustrative purposes and, thus, are provided to illustrate the general structures of the present invention. Furthermore, various aspects of the present invention are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion.

Furthermore, relative terms such as "on" or "above" are used herein to describe one structure's or portion's relationship to another structure or portion as illustrated in the Figures. It will be understood that relative terms such as "on" or "above" are intended to encompass different orientations of the device in addition to the orientation depicted in the Figures. For example, if the device in the Figures is turned over, structure or portion described as "above" other structures or portions would now be oriented "below" the other structures or portions. Likewise, if the device in the Figures is rotated along an axis, structure or portion described as "above" other structures or portions would now be oriented "next to" or "left of" the other structures or portions. Like numbers refer to like elements throughout.

As shown in the figures for the purposes of illustration, embodiments of the present invention are exemplified by a light emitting die package including a stem substrate, wire leads, and a light emitting diode. The stem substrate has a first end surface and a second end surface and defines at least one groove. The wire leads are attached to the groove of the stem substrate, terminating at the first end surface. The light emitting diode is mounted on the first end surface and makes making electrical and thermal contact with the stem substrate. The LED is also connected to the wire lead.

The stem substrate forms the body of the die package and draws heat away from the LED (as opposed to merely the wire leads drawing heat away from the LED as implemented in the prior art). Because the stem substrate is relatively much thicker than the wire leads, the heat dissipation capacity is greater than the prior art designs. The stem substrate provides for a relatively huge thermal mass and effective heat-spreading capability along its entire length. Accordingly, more power can be delivered to the LED, and the LED can produce more light. Furthermore, for the same reason, the light emitting die package of the present invention may not require a separate heat sink slugs or leads that extend away from the package. Accordingly, the die package of the present invention may be more compact, more reliable, and less costly to manufacture than the die packages of the prior art.

Furthermore, whereas much of the prior art LED packages are flat and all their leads and heat sink are connected in the top face or in the same plane as the optical system. This has a disadvantage of occupying valuable area, or "real estate" on a printed circuit board that drive a package. The light emitting die package of the present invention has a step shape with a relatively long body and a relatively small footprint. The small footprint allows more units be packed as cluster to produce high intensity light source for illumination applications similar to conventional light sources such as incandescent light or halogen light bulbs.

Figure 2:
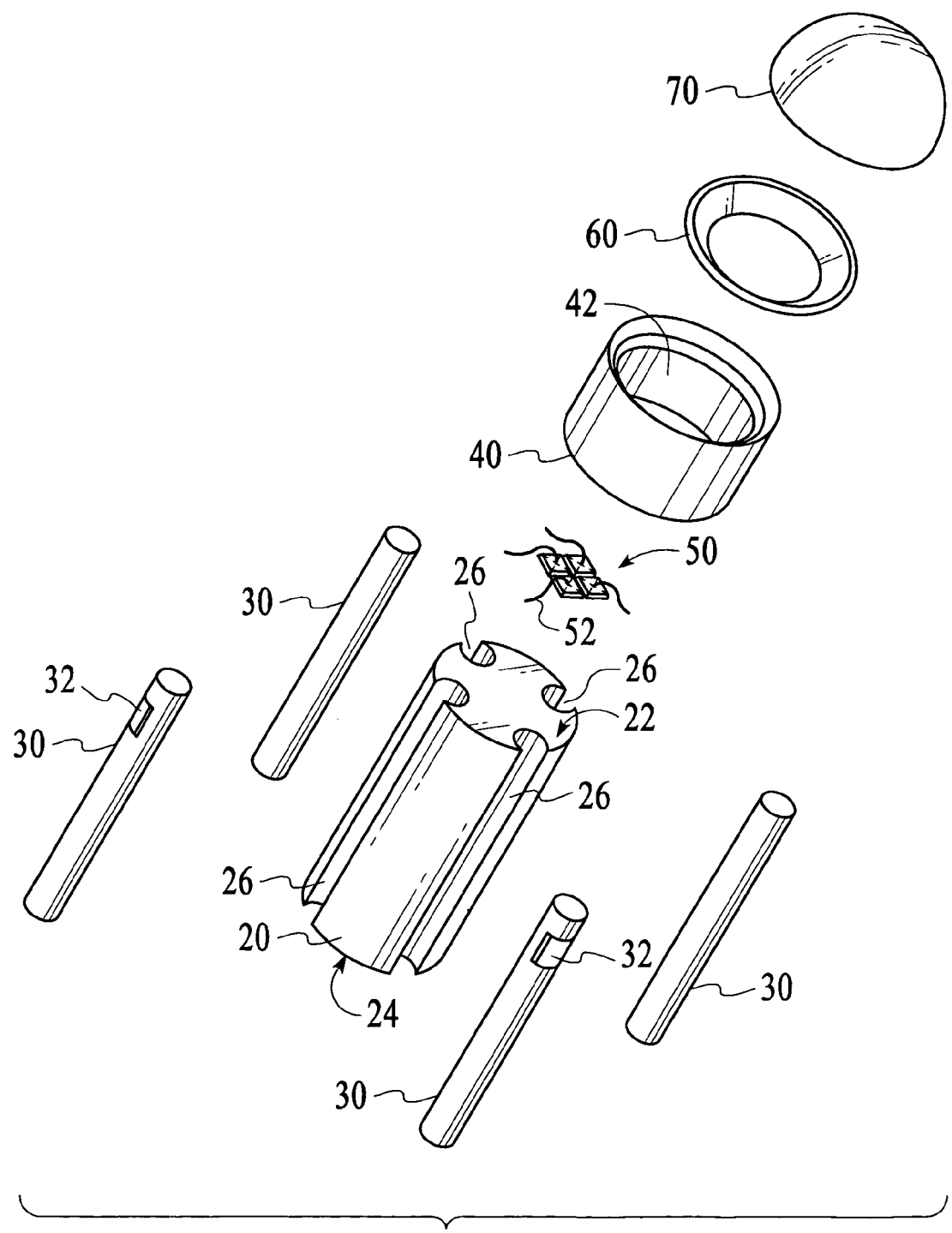
FIG. 2 is an exploded perspective view of the light emitting die package of FIG. 1.
Figure 3:
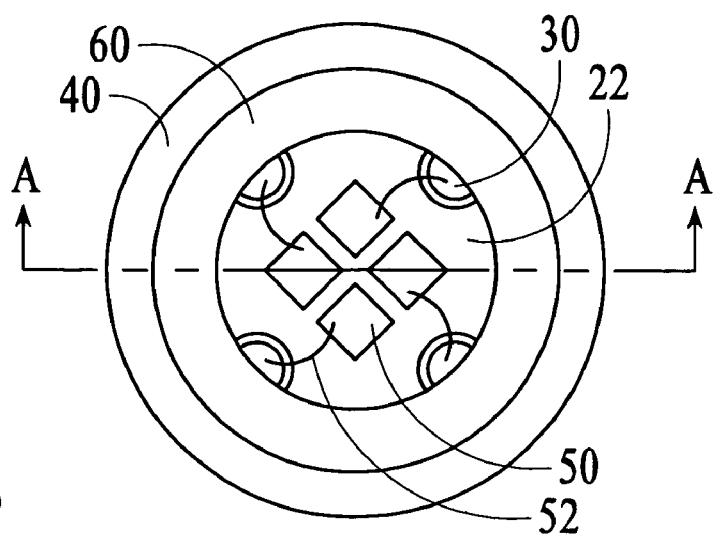
FIG. 3 is a top view of the light emitting die package of FIG. 1.
Figure 4:
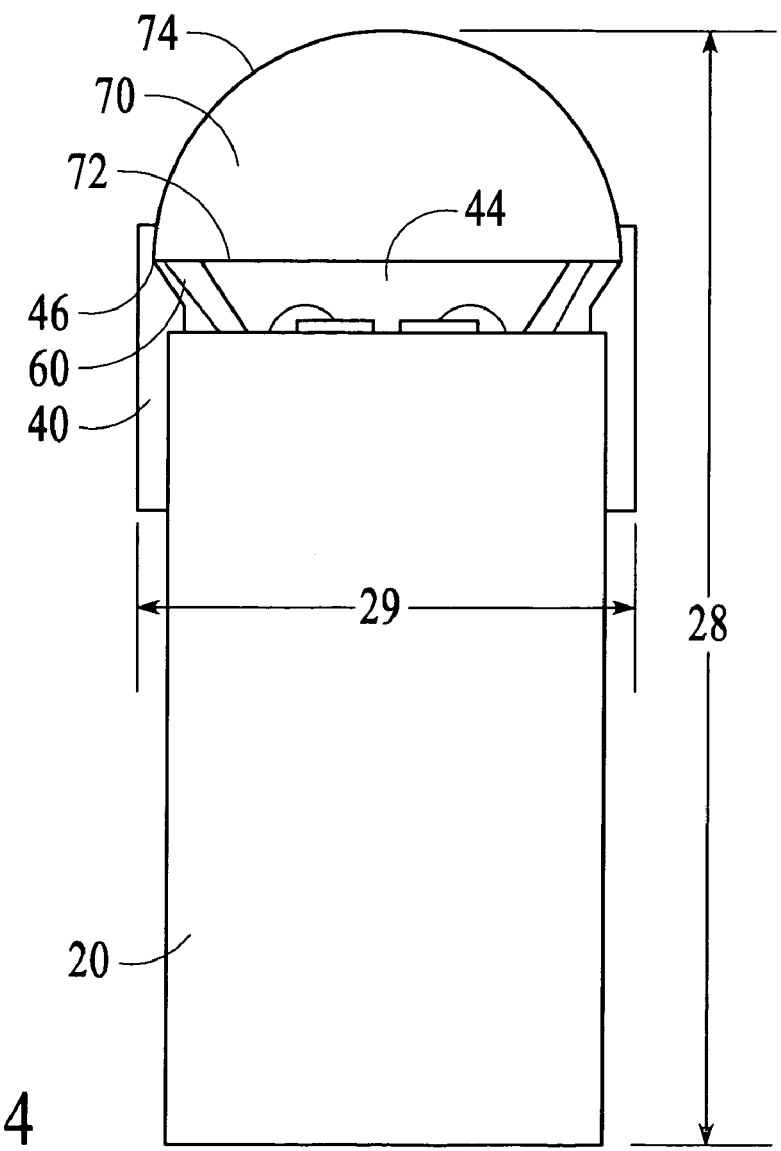
FIG. 4 is a cut-away side view of the light emitting die package of FIG. 1 cut along line A—A as illustrated in FIG. 3.
Figure 5A:
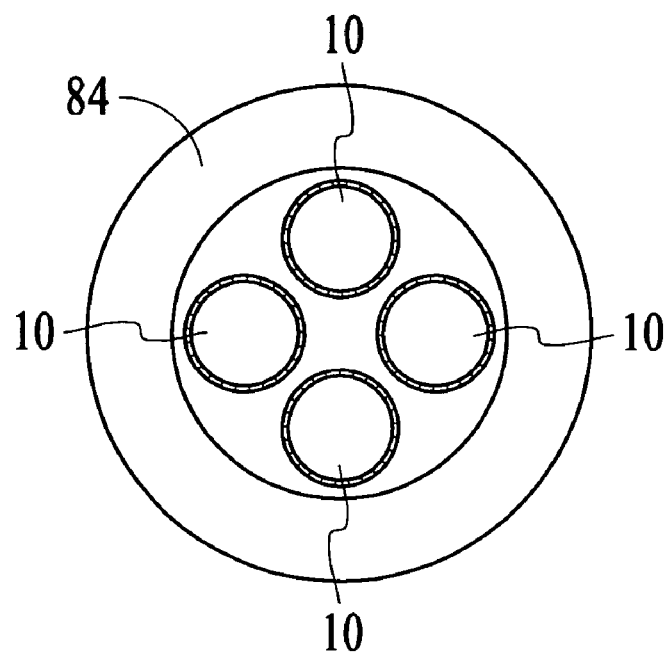
FIGS. 5A through 5D illustrate, respectively, a top view, side view, bottom view, and a cutaway side view of the light emitting die of FIG. 1.
Figure 5B:
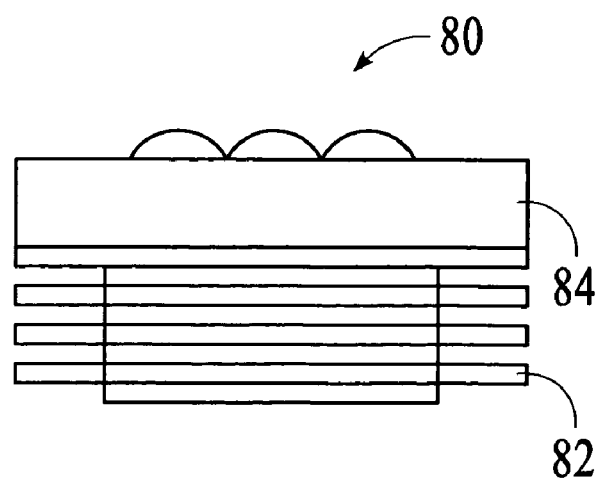
Figure 5C:
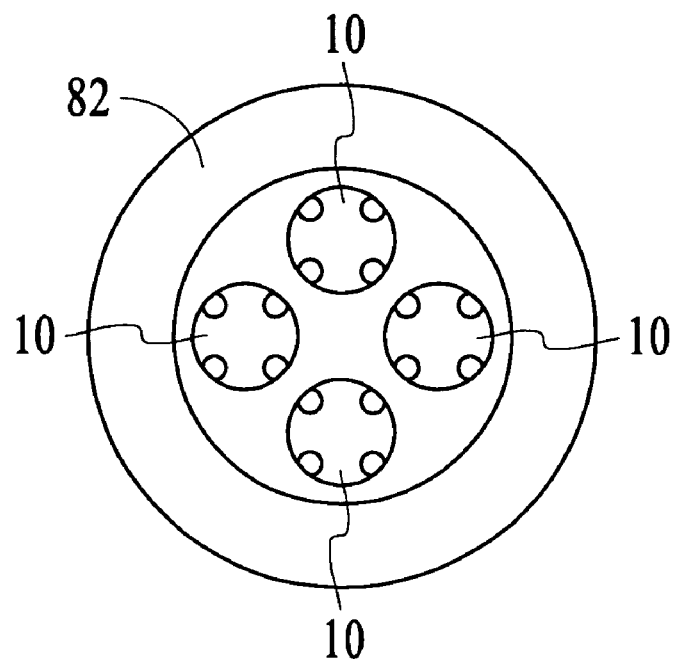
Figure 5D:
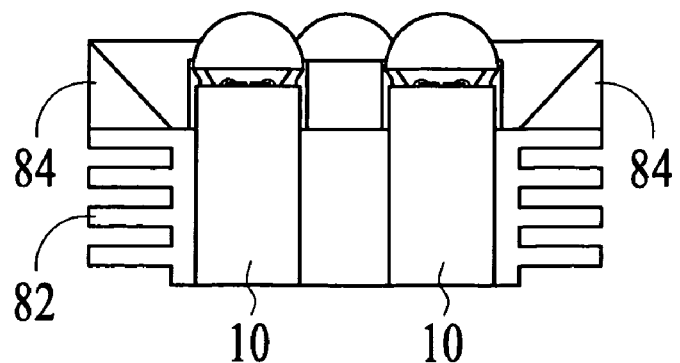

FIG. 1 is a perspective view of a light emitting die package 10 according to one embodiment of the present invention. FIG. 2 is an exploded perspective view of the light emitting die package 10 of FIG. 1. FIG. 3 is a top view of portions of the light emitting die package 10. Specifically, FIG. 3 illustrates a top view of the light emitting die package through a clear lens 70. FIG. 4 is a cut-away side view of the light emitting die package of FIG. 1 cut along line A—A as illustrated in FIG. 3. Referring to FIGS. 1 through 4, the light emitting die package 10 includes a stem substrate 20, wire leads 30, and light emitting diode (LED) assembly 50.

The stem substrate 20 has a first end surface 22 and a second end surface 24 and is made of electrically and thermally conductive material such as, for example only, copper, aluminum, or ceramic materials. In some embodiments, the first end surface 22 can be plated with precious metal to enable or improve bonding with the LED assembly 50, but this is not required. The stem substrate 20 defines at least one groove 26. In the Figures, four grooves 26 are illustrated. The stem substrate can be formed by machining or extrusion of copper, aluminum, or ceramics. The first end surface 22 can be plated or finished with metal that allows LED chip to attach and to bond. The second end surface 24 may be plated, finished, or otherwise configured for connecting to an external heat sink, external circuits, or both.

Each of the wire leads 30 runs along one of the grooves 26 defined by the stem substrate 20. The wire leads terminate at the first end surface 22. In fact, as illustrated, the wire leads 30 may be positioned within the grooves 26 since the grooves 26 in the illustrated embodiment are sufficiently deep; however, the wire leads 30 are electrically isolated from the stem substrate 20 by wire lead insulation material such as polyimides wrapping each of the wire leads. A portion of the wire lead insulation of each of the wire leads 30 are stripped, exposing a portion (exposed portion 32) of the wire lead for electrical connection to external circuit. The wire leads 30 can be bonded to the stem substrate 20 using high-temperature adhesive. The first end surface of the wire leads can be metalized, by plating for example, for bonding by bond wires connecting it to the LEDS. In some embodiments, depending on the size and the shape of the grooves 26, the wire leads 30 may require roll-forming. For example, the wire leads 30 may be magnet wires which are insulated by plastic dielectric materials.

The LED assembly 50 includes at least one light emitting diode (LED) and is mounted on the first end surface 22, the LEDS making electrical and thermal contact with the stem substrate 20. In the Figures, for the purposes of illustration, the LED assembly 50 is show with four LEDS. Each of the LEDS is connected to one of the wire leads 30 using a bond wire 52. The bond wires 52 are illustrated also in FIG. 3. Alternatively, the LED may be connected to the wire lead using solder or ball-grid-array connections.

Continuing to refer to FIGS. 1 through 4, the light emitting die package 20 further includes a sleeve 40 surrounding the stem substrate 20 proximal to the first end surface 26. The sleeve 40 defines an opening 42 at and surrounding the first end surface 26. The sleeve includes a ledge 46 adapted to couple the lens 70, when mounted on the ledge 46, aligns the lens 70 with light from the LED assembly 50. The ledge 46 is also illustrated in FIG. 4 illustrating a cut-away side view of the light emitting die package 10 of FIG. 1 cut along line A—A as illustrated in FIG. 3.

The lens 70 is adapted for optical imaging functions such as, for example only, diffusion, focusing, and wavelength shifting. The lens 70 operates on the light generated by the LED assembly 50 by, for example, reflecting, directing, focusing, and shifting wavelengths. For example, a bottom surface 72 of the lens 70 can be coated with calcium carbonate to diffuse the light. Alternately, the bottom surface 72 of the lens 70 can be coated with phosphors to absorb light having a first wavelength and reemit the light at a second wavelength. In fact, the bottom surface 72 of the lens 70 can be configured for various optical operations. For example, it can be grooved to reflect or refract light from the LED assembly 50. Likewise, the top dome surface can also be used to operate on the light resulting in a predetermined radiation pattern of the die package 10. The lens 70 can be made with high temperature plastic or glass.

When the lens 70 is placed on the ledge 46 over the opening 42, an enclosed cavity 44 is formed by the first surface 22 of the stem substrate 20, the opening 42, and the lens 70. The enclosed cavity 44 is at least partially filled by clear encapsulant such as Silicone. The enclosed cavity 44 need not be completely filled with the encapsulant. In fact, partially filling the cavity 44 with encapsulant while leaving gaps within the cavity 44 allows the encapsulant to expand (when heat is generated by the LED assembly 50) without separating the lens 70 from the sleeve 40. Further, the lens 70 is slightly movably coupled to the sleeve 40 to allow the encapsulant to expend even further than the expansion allowed by the gap. In an alternative embodiment, the cavity 44 is completely filled by the encapsulant so that there is no gap or air bubble within the cavity 44. In this case, as the encapsulant expands due to heat generated by the LED assembly 50, the lens is allowed slight up and down movements to relieve the pressure caused by the expansion. The encapsulant is selected for predetermined refractive index and other optical properties, physical properties, or both.

The light emitting die package 10 includes a reflector 60 coupled to the sleeve 40, the reflector 60, the reflector 60 surrounding the opening 42 and is adapted to reflect light from the LEDS of the LED assembly 50 by having a reflective surface angled such that the reflector 60 reflects light from the LED assembly 50 toward the lens 70. The sleeve 40 operates to align both the reflector 60 and the lens 70 relative to the stem substrate 20. The reflector 60 can be made of any reflective material or non-reflective material but with a high reflective finish such as silver plating. The reflector 60 is electrically isolated from the stem substrate 20. The reflector cup is mounted proximal to the LED assembly 50 to direct all the light emitted by LED towards the lens.

In FIG. 4, measurements of the sample light emitting die package 10 are illustrated. In the illustrated embodiment, the light emitting die package 10 has a height 28 in the order of millimeters (mm) or tens of mm, for example 13.25 mm and width, or diameter 29 in the example, in the order of mm, for example, 5.6 mm.

The light emitting die package 10 can be grouped to form light emitting die array 80 illustrated in FIGS. 5A through 5D where FIGS. 5A through 5D illustrate, respectively, a top view, side view, bottom view, and a cutaway side view of the light emitting die array 80.

Referring to FIGS. 5A through 5D, the light emitting die array 80 includes an array housing including an external heatsink 82 and reflector bowl 84, the array housing defines die package spaces, or "holes," to receive light emitting die packages 10. In the Figures, four light emitting die packages 10 fill these reception holes. Each of these light emitting die packages 10 are configured as illustrated in FIGS. 1–4.

FIGS. 1–4 can be used to describe the method of manufacturing the light emitting die package 10. Referring again to FIGS. 1–4, to manufacture the light emitting die package 10 of FIGS. 1–4, a relatively long piece of stem substrate rod (not illustrated) is fabricated, the stem substrate rod defining at least one groove. Relatively wire leads are attached to the grooves of the stem substrate rod. Then, the stem substrate rod including the attached wire leads such as magnet wires are cut to a predetermined length thereby forming an individual stem substrate 20 including the attached wire leads 30 as illustrated in FIGS. 1–4, the wire leads already attached to the stem substrate 20. The individual stem substrate including the attached wire leads 30 are planarized to form the first end surface 22.

Then, the LED assembly 50 including at least one light emitting device (LED) such as a light emitting diode is mounted on the first end surface 22, the LED assembly 50 making electrical and thermal contact with the stem substrate 20, the LED also connected to the wire lead via wire bonds 52. The LED can be encapsulated in an encapsulant as discussed above. The sleeve 40 is attached to the stem substrate 20 proximal to the first end surface 22. The sleeve defines the opening 42 at and around the first end surface 22. The reflector 60 is then coupled to the sleeve 40, the reflector surrounding the opening 42. Finally, the lens 70 is coupled to the opening 42 of the sleeve 40. The exact order of these manufacturing steps may vary and still be within the scope of the present invention.

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used to practice the present invention. The invention is limited by the claims that follow.

What is claimed is:

1. A method of manufacturing a light emitting die package, the method comprising:

fabricating a stem substrate rod having a predetermined length, the stem substrate rod defining at least one groove;

attaching wire lead on the groove of the stem substrate rod;

cutting the stem substrate rod including the attached wire leads to a predetermined length thereby forming an individual stem substrate;

planarizing a first end surface of the individual stem substrate; and mounting a light emitting diode (LED) on the first end surface, the LED making electrical and thermal contact with the stem substrate, the LED also connected to the wire lead.

2. The method recited in claim 1 further comprising encapsulating the LED.

3. The method recited in claim 1 further comprising attaching a sleeve surrounding the stem substrate proximal to the first end surface, the sleeve defining an opening at the first end surface.

4. The method recited in claim 2 further comprising coupling a reflector on the sleeve, the reflector surrounding the opening.

5. The method recited in claim 2 further comprising coupling a lens to the sleeve, the lens covering the opening.

* * * * *